US009554493B2

(12) United States Patent
Kawai

(10) Patent No.: US 9,554,493 B2
(45) Date of Patent: Jan. 24, 2017

(54) HOLDER AND NOISE CURRENT ABSORBER

(71) Applicant: Kitagawa Industries Co., Ltd., Inazawa-shi, Aichi (JP)

(72) Inventor: Hideharu Kawai, Inazawa (JP)

(73) Assignee: Kitagawa Industries Co., Ltd., Inazawa-shi, Aichi (JP)

( * ) Notice: Subject to any disclaimer, the term of this patent is extended or adjusted under 35 U.S.C. 154(b) by 0 days.

(21) Appl. No.: 14/785,790

(22) PCT Filed: Aug. 6, 2014

(86) PCT No.: PCT/JP2014/070734
§ 371 (c)(1),
(2) Date: Oct. 20, 2015

(87) PCT Pub. No.: WO2015/020087
PCT Pub. Date: Feb. 12, 2015

(65) Prior Publication Data
US 2016/0073557 A1  Mar. 10, 2016

(30) Foreign Application Priority Data

Aug. 8, 2013 (JP) .................................. 2013-165155

(51) Int. Cl.
*H05K 9/00* (2006.01)
*H01F 17/06* (2006.01)
(Continued)

(52) U.S. Cl.
CPC ............... *H05K 9/0018* (2013.01); *F16B 1/00* (2013.01); *H01F 17/06* (2013.01); *H01F 27/263* (2013.01);
(Continued)

(58) Field of Classification Search
CPC ........................... H05K 9/0018; H05K 9/0066
See application file for complete search history.

(56) References Cited

U.S. PATENT DOCUMENTS

| 4,885,559 A * | 12/1989 | Nakano ................... H01F 17/06 324/127 |
| 5,343,184 A * | 8/1994 | Matsui .................... H01F 17/06 324/127 |

(Continued)

FOREIGN PATENT DOCUMENTS

| JP | H07240317 A | 9/1995 |
| JP | 2007/266214 A | 10/2007 |

OTHER PUBLICATIONS

International Preliminary Report on Patentability (Chapter 1) dated Feb. 9, 2016, including Written Opinion of the International Search Authority dated Sep. 9, 2014, both for Application No. PCT/JP2014/070734.

(Continued)

*Primary Examiner* — Hung V Ngo
(74) *Attorney, Agent, or Firm* — Jenkins, Wilson, Taylor & Hunt, P.A.

(57) ABSTRACT

A holder for a noise current absorber in one aspect of the invention comprises a pair of accommodating portions, and one or more pairs of an engaging portion and an engaged portion. The accommodating portion accommodates a magnetic body. The engaging portion and the engaged portion are engaged with each other and maintain a state that a pair of the magnetic bodies exhibits a cylindrical shape or an annular shape. The engaging portion and the engaged portion form a through hole that penetrates in an insertion direction of the engaging portion. When at least one of the engaging portion and the engaged portion is elastically deformed by using a jig inserted in the through hole, engagement between the engaging portion and the engaged portion is released.

13 Claims, 4 Drawing Sheets

(51) Int. Cl.
    *H01F 27/26*  (2006.01)
    *H01F 27/30*  (2006.01)
    *F16B 1/00*  (2006.01)
    *F16B 2/06*  (2006.01)
    *F16B 7/04*  (2006.01)
(52) U.S. Cl.
    CPC ............... *H01F 27/306* (2013.01); *F16B 2/06* (2013.01); *F16B 7/0426* (2013.01); *F16B 2001/0035* (2013.01)

(56) References Cited

U.S. PATENT DOCUMENTS

| | | | | |
|---|---|---|---|---|
| 5,355,109 A | * | 10/1994 | Yamazaki | H01F 17/06 174/664 |
| 6,144,277 A | * | 11/2000 | Matsui | H01F 17/06 333/12 |
| 6,160,466 A | * | 12/2000 | Kawai | H01F 17/06 336/176 |
| 6,285,265 B1 | * | 9/2001 | Morita | H01F 17/06 333/12 |
| 6,437,678 B1 | * | 8/2002 | Konz | H01F 17/06 336/174 |
| 6,515,230 B1 | * | 2/2003 | Hirakawa | H01F 17/06 174/92 |
| 2002/0024402 A1 | * | 2/2002 | Morita | H01F 17/06 333/12 |

OTHER PUBLICATIONS

Notification of Transmittal of Translation of the International Preliminary Report on Patentability (Chapter 1) for Application No. PCT/JP2014/070734 dated Feb. 18, 2016.

International Search Report for Application No. PCT/JP2014/070734 dated Sep. 9, 2014.

* cited by examiner

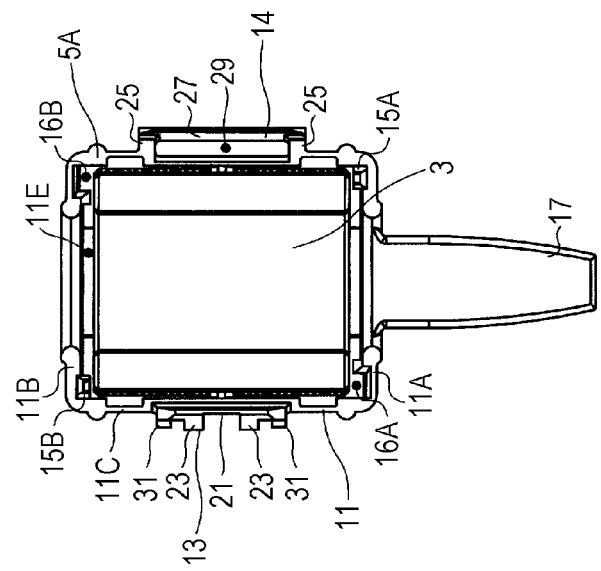
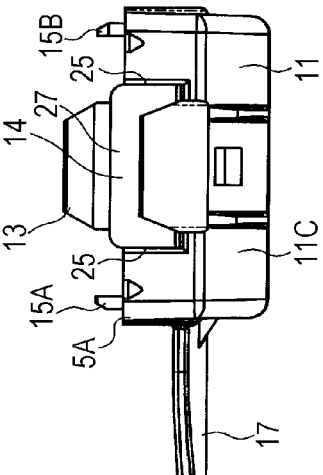
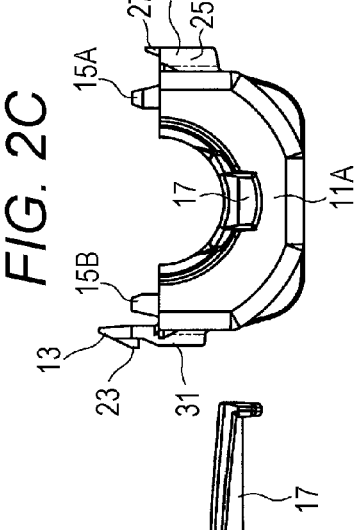
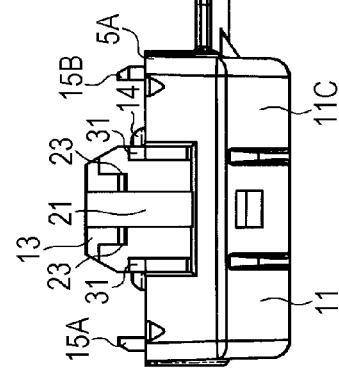

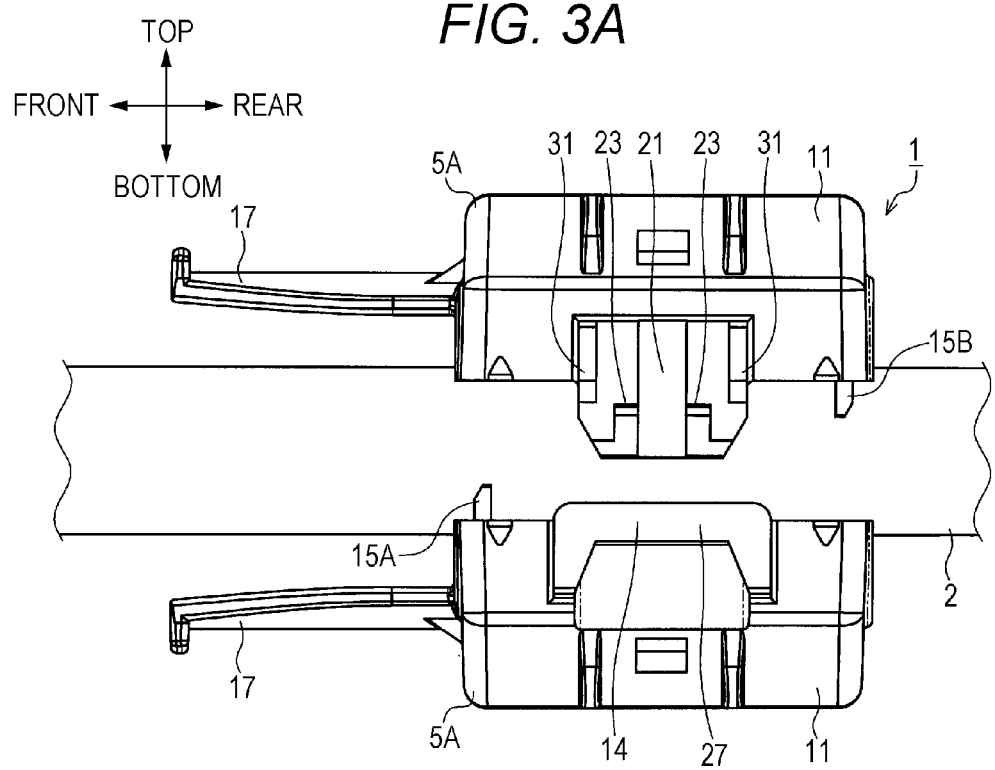
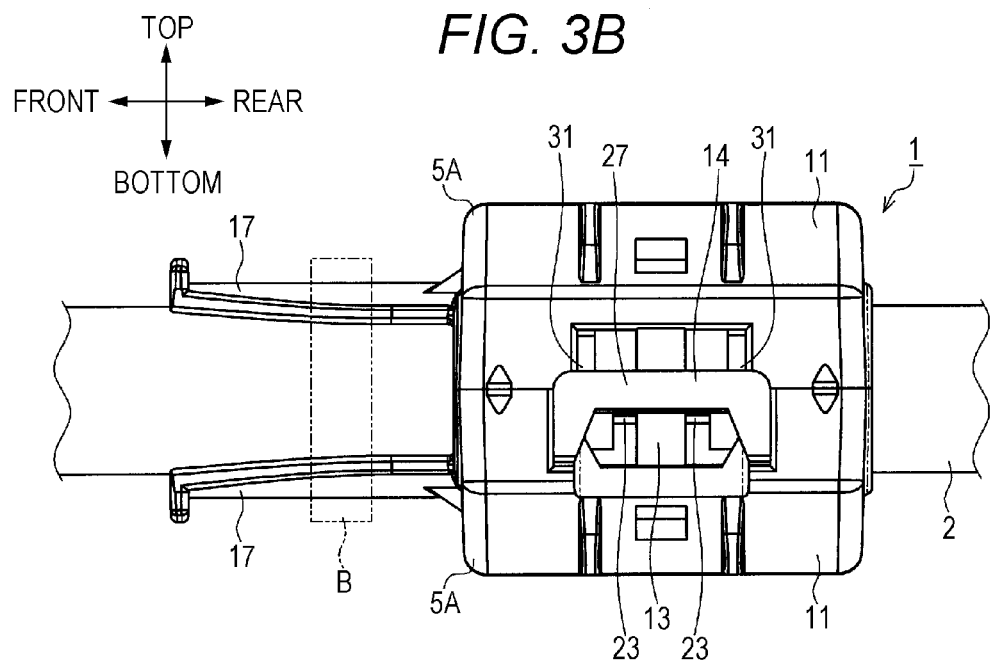

HOLDER AND NOISE CURRENT ABSORBER

CROSS-REFERENCE TO RELATED APPLICATION

This international application claims priority based on Japanese Patent Application No. 2013-165155 filed in Japan Patent Office on Aug. 8, 2013, which is incorporated in this international application by reference in its entirety.

TECHNICAL FIELD

The present invention relates to a holder for a noise current absorber and a noise current absorber.

BACKGROUND ART

A noise current absorber that is attached to an electric wire and absorbs noise current flowing through the electric wire has been known. As one of the noise current absorbers, a noise current absorber that includes a pair of magnetic bodies and a holder is available. When abutting against each other, the pair of magnetic bodies exhibits a cylindrical shape or an annular shape (both of the shapes are hereinafter collectively referred to as the cylindrical shape) as a whole of the pair of magnetic bodies. The holder holds both of the magnetic bodies in a state that the pair of magnetic bodies exhibits the cylindrical shape.

When the noise current absorber with such a structure is attached to the electric wire, the pair of magnetic bodies in the cylindrical shape surrounds the electric wire from an outer peripheral side. As a result, the pair of magnetic bodies magnetically forms a closed magnetic path and exerts intended noise current absorbing capacity (for example, see Patent Document 1).

PRIOR ART DOCUMENTS

Patent Documents

Patent Document 1: Japanese Unexamined Patent Application Publication No. 7-240317

SUMMARY OF THE INVENTION

Problems to be Solved by the Invention

A noise current absorber that is configured to be attachable to an electric wire when an engaging portion and an engaged portion are engaged with each other has been known. Such an engagement structure is configured to allow an operation for catching the engaging portion or the engaged portion with a fingertip from a specified direction so as to release the engagement therebetween, for example. However, there is a case where it is difficult to catch the engaging portion or the engaged portion with the fingertip from an opposite direction from the above-described specified direction in such an engagement structure. Accordingly, if it is desired to release the engagement in this case, the operation has to be performed from the specified direction.

However, depending on a position where the noise current absorber is attached, the operation from the above-described specified direction may also be difficult. For example, when the noise current absorber is attached to a position deep inside of equipment or a position where various structures are arranged on the periphery, the operation from the above-described specified direction is difficult depending on an orientation of the noise current absorber. In this case, the operation cannot be performed from the above-described specified direction, and the engagement cannot be released by the operation from the above-described opposite direction. Thus, the noise current absorber cannot be detached.

In addition, there is a case where the noise current absorber is provided with two pairs of engagement structures. One of the engagement structures may be configured to allow the engagement to be released when the operation is performed from the specified direction, and the other of the engagement structures may be configured to allow the engagement to be released when the operation is performed from the opposite direction from the specified direction. In this case, even when the orientation of the noise current absorber is set in an orientation to allow the operation from the specified direction on the one of the engagement structures, the engagement cannot be released by the operation from the specified direction on the other of the engagement structures. Thus, also in this case, the noise current absorber cannot be detached.

Therefore, in one aspect of the invention, it is desired to provide a holder for a noise current absorber and a noise current absorber, both of which allow an operation for releasing engagement to be performed either from a specified direction or an opposite direction therefrom.

Solutions to the Problems

A holder for a noise current absorber in one aspect of the invention comprises a pair of accommodating portions and one or more pairs of an engaging portion and an engaged portion. In the pair of accommodating portions, each accommodating portion comprises a recess. Each recess is capable of accommodating each of a pair of magnetic bodies therein. The pair of accommodating portions are configured that the pair of magnetic bodies abuts against each other to exhibit a cylindrical shape or an annular shape as a whole of the pair of magnetic bodies when the recesses are provided to face each other and the accommodating portions abut against each other in a state that each magnetic body is accommodated in each recess. The one or more pairs of the engaging portion and the engaged portion are attached to each of the pair of accommodating portions, and are configured to be able to maintain a state that the pair of magnetic bodies exhibits the cylindrical shape or the annular shape by engagement of the engaging portion and the engaged portion with each other when the recesses are arranged to face each other and the accommodating portions abut against each other. The engaging portion and the engaged portion are configured to be engaged with each other in the case where at least one of the engaging portion and the engaged portion is displaced to an engagement position while being elastically deformed and reaches the engagement position when the engaging portion is inserted in the engaged portion. Furthermore, the engaging portion and the engaged portion are configured to form a through hole that penetrates in an insertion direction of the engaging portion in a state of being engaged with each other. The through hole is configured that a jig can be inserted in the through hole from either one of openings provided at both ends of the through hole. The engaging portion and the engaged portion are configured that engagement between the engaging portion and the engaged portion is released and the engaging portion can be pulled out of the engaged portion when at least one of the engaging portion and the engaged portion is applied with an external force to be elastically deformed by using the jig inserted in the through hole.

According to the holder for a noise current absorber that is configured as described above, the engaging portion and the engaged portion form the through hole that penetrates in the insertion direction of the engaging portion when abutting against each other. The jig can be inserted in this through hole from either one of the openings provided at both of the ends of the through hole. When the jig inserted in the through hole is used for applying the external force to the engaging portion or the engaged portion, the engaging portion or the engaged portion is elastically deformed, and thus the engagement is released. As a result, the engaging portion is brought into a state capable of being pulled out of the engaged portion.

Accordingly, in such a holder, the jig can be inserted in the through hole from a specified direction. The jig can also be inserted from an opposite direction from the specified direction. Thus, an operation for releasing the engagement can be performed from either the specified direction or the opposite direction therefrom. Therefore, compared to a conventional article in which the engagement can only be released by the operation from the specified direction, the noise current absorber can easily be detached from an electric wire.

The above-described holder for a noise current absorber may comprise a pair of resin components that are molded in a same shape. The accommodating portion, the engaging portion, and the engaged portion are integrally molded in each resin component. It is configured that the engaging portion provided in one of the pair of resin components and the engaged portion provided in the other resin component are engaged with each other, and it is configured that the engaging portion provided in the other resin component and the engaged portion provided in the one resin component are engaged with each other.

According to the holder for a noise current absorber that is configured as described above, the pair of resin components is molded in the same shape, and the accommodating portion, the engaging portion, and the engaged portion are integrally molded in each resin component. Thus, two pairs of engaging portion and engaged portion have structures with rotational symmetries that exhibit the same shape even when being rotated by 180 degrees. Therefore, the insertion direction of each engaging portion with respect to each engaged portion is the opposite direction from each other.

However, the jig can be inserted in the through hole that penetrates in the insertion direction from either one of the openings provided at both of the ends of the through hole. Thus, the engagement at two positions can be released by the operation from the same side on the noise current absorber by inserting the jig in the one through hole from the same direction as the insertion direction of the engaging portion and by inserting the jig in the other through hole from the opposite direction from the insertion direction of the engaging portion. Therefore, compared to the conventional article in which only one side of the engagement can be released by the operation from the specified direction, the noise current absorber can easily be detached from the electric wire.

In the above-described holder for a noise current absorber, the engaging portion may comprise a groove and a pair of locking claws. The groove is formed to extend in the insertion direction. The pair of locking claws is projected at positions on both sides of the groove that is held therebetween. The engaged portion may comprise a pair of supports and a bridge. The pair of supports is projected to provide a space, in which the engaging portion can be introduced, therebetween. The bridge is stretched between the pair of supports. The engaging portion is brought into a state incapable of being pulled out of the engaged portion when the engaging portion is inserted in a gap that is surrounded by the pair of supports and the bridge, and the pair of locking claws hooks on the bridge. The groove and the bridge are configured to form the through hole in this state.

According to the holder for a noise current absorber that is configured as described above, when the jig is inserted in the groove as described above and then the external force is applied to the engaging portion or the engaged portion by using the jig, the engaging portion or the engaged portion is elastically deformed in a direction that the bridge and the locking claws separate from each other, and thus the engagement therebetween can be released. In addition, the groove and the bridge form the through hole as described above. Thus, the jig can be inserted from either one of the openings provided at both of the ends of the through hole. Therefore, compared to the conventional article in which the engagement can only be released by the operation from the specified direction, the noise current absorber can easily be detached from the electric wire.

In the above-described holder for a noise current absorber, the engaging portion may comprise a restricting portion. This restricting portion is configured that, when the engaging portion is displaced in a direction of the gap between the pair of supports in the state of being inserted in the engaged portion, the restricting portion abuts against the support on a displacement direction side and thereby restricts further displacement of the engaging portion to the displacement direction side.

According to the holder for a noise current absorber that is configured as described above, in the case where the engaging portion is displaced in the direction of the gap between the pair of supports when the engaging portion is inserted in the engaged portion, the restricting portion abuts against the support on the displacement direction side of the engaging portion. Thus, the engaging portion is brought into a state that the further displacement thereof to the displacement direction side is restricted. Therefore, compared to a case where the engaging portion is configured that the displacement is not restricted even when the engaging portion is excessively and significantly displaced in the direction of the gap between the supports, unexpected deformation of the engaging portion or another portion, which is caused by the excessive displacement of the engaging portion, is inhibited. In addition, occurrence of a problem that the engagement is released in conjunction with such deformation is inhibited.

The above-described holder for a noise current absorber may comprise one or more pairs of a fitting portion and a fitted portion. The one or more pairs of the fitting portion and the fitted portion are provided to each of the pair of accommodating portions and are configured that the fitting portion and the fitted portion are fitted to each other when the recesses are arranged to face each other and the accommodating portions abut against each other. The fitting portion and the fitted portion are configured to maintain a state that the pair of accommodating portions is arranged at specified relative positions when in a state of being fitted to each other even in the case where an operation for releasing engagement between the engaging portion and the engaged portion is performed by using the jig.

According to the holder for a noise current absorber that is configured as described above, in the case where the fitting portion and the fitted portion are in the state of being fitted to each other, the pair of accommodating portions is maintained in the state of being arranged at the specified relative positions even when the operation for releasing the engagement between the engaging portion and the engaged portion is performed by using the jig.

Accordingly, in the case where the operation for releasing the engagement between the engaging portion and the engaged portion is performed by using the jig, in contrast to a holder that causes misalignment of the relative positions of the pair of accommodating portions upon receipt of an operation force, a cross section (a cross section perpendicular to a penetrating direction) of the through hole is inhibited from being changed by occurrence of such misalignment. Thus, compared to a case where the cross section of the through hole is changed (for example, the cross section is narrowed), a significant change in operation feeling of the jig during releasing of the engagement of the holder is inhibited. Therefore, the jig is easily operated, and engagement releasing work on the holder can be easily performed.

In addition, when the pair of accommodating portions is maintained in the state of being arranged at the specified relative positions, a relative positional relationship between the engaging portion and the engaged portion is also maintained. Accordingly, occurrence of unnecessary twisting between the engaging portion and the engaged portion is inhibited. Thus, compared to a case where the unnecessary twisting occurs to the engaging portion due to the misalignment of the relative positions of the pair of accommodating portions, there is no need to add an excessive deforming operation for eliminating such twisting. Therefore, the operation for releasing the engagement between the engaging portion and the engaged portion can be smoothly performed.

A noise current absorber in one aspect of the invention comprises a pair of magnetic bodies, a pair of accommodating portions, and one or more pairs of an engaging portion and an engaged portion. The pair of magnetic bodies is configured to exhibit a cylindrical shape or an annular shape as a whole of the pair of magnetic bodies when abutting against each other. Each of the pair of accommodating portions comprises a recess. Each recess is capable of accommodating each of the pair of magnetic bodies therein. The pair of accommodating portions is configured that the pair of magnetic bodies exhibits the cylindrical shape or the annular shape when the recesses are arranged to face each other and the accommodating portions abut against each other in a state that each magnetic body is accommodated in each recess. The one or more pairs of the engaging portion and the engaged portion are provided to each of the pair of accommodating portions and are configured to be able to maintain a state that the pair of magnetic bodies exhibits the cylindrical shape or the annular shape in the case where the engaging portion and the engaged portion are engaged with each other when the recesses are arranged to face each other and the accommodating portions abut against each other. The engaging portion and the engaged portion are configured to be engaged with each other in the case where at least one of the engaging portion and the engaged portion is displaced to an engagement position while being elastically deformed and reaches the engagement position when the engaging portion is inserted in the engaged portion. Furthermore, the engaging portion and the engaged portion are configured to form a through hole that penetrates in an insertion direction of the engaging portion in a state of being engaged with each other. The through hole is configured that a jig can be inserted in the through hole from either one of openings provided at both ends of the through hole. The engaging portion and the engaged portion are configured that engagement between the engaging portion and the engaged portion is released and the engaging portion can be pulled out of the engaged portion when at least one of the engaging portion and the engaged portion is applied with an external force to be elastically deformed by using the jig inserted in the through hole.

The noise current absorber that is configured as described above has a similar configuration as the above-described holder. Thus, the jig can be inserted in the through hole from the specified direction. In addition, the jig can also be inserted in the through hole from the opposite direction from the specified direction. For this reason, the operation for releasing the engagement can be performed from either the specified direction or the opposite direction therefrom. Therefore, compared to the conventional article in which the engagement can only be released by the operation from the specified direction, the noise current absorber can easily be detached from the electric wire.

BRIEF DESCRIPTION OF THE DRAWINGS

FIGS. 2A to 2D are views of one of resin components and one of magnetic bodies that constitute the noise current absorber, in which FIG. 2A is a plan view, FIG. 2B is a left side view, FIG. 2C is a front view, and FIG. 2D is a right side view.

FIGS. 3A to 3B are explanatory views of an attached state of the noise current absorber in a right side view.

DESCRIPTION OF REFERENCE SIGNS

Figure 1A:
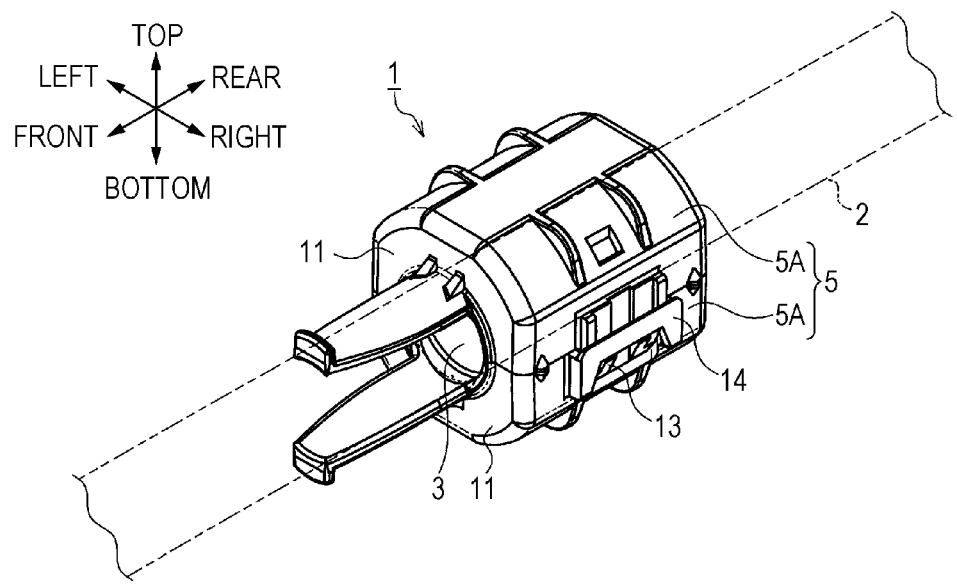
FIG. 1A is a perspective view of a noise current absorber.

1 Noise current absorber
2 Electric wire
3 Magnetic body
5 Holder
5A Resin component
11 Accommodating portion
11A First side wall
11B Second side wall
11C Peripheral wall
11E Recess
13 Engaging portion
14 Engaged portion
15A, 15B Fitting portion
16A, 16B Fitted portion
17 Extending piece
21 Groove
23 Locking claw
25 Support
27 Bridge
29 Gap
31 Restricting portion
35 Through hole

DESCRIPTION OF EMBODIMENTS

Next, a description will be made on an exemplary embodiment of the invention. It should be noted that, in the following description, the description will be made by using each of up, down, right, left, front, and rear directions given in the drawings when necessary. However, each of these directions is a direction that is merely defined to make a brief description on a relative positional relationship among each component that constitutes a noise current absorber or a holder. Any orientation of the noise current absorber or the holder faces may be set when the noise current absorber or the holder is actually used. For example, the noise current absorber or the holder may be used in a state that the up-down direction indicated in the drawings does not correspond to a vertical direction due to a relation with gravity.

Figure 1B:
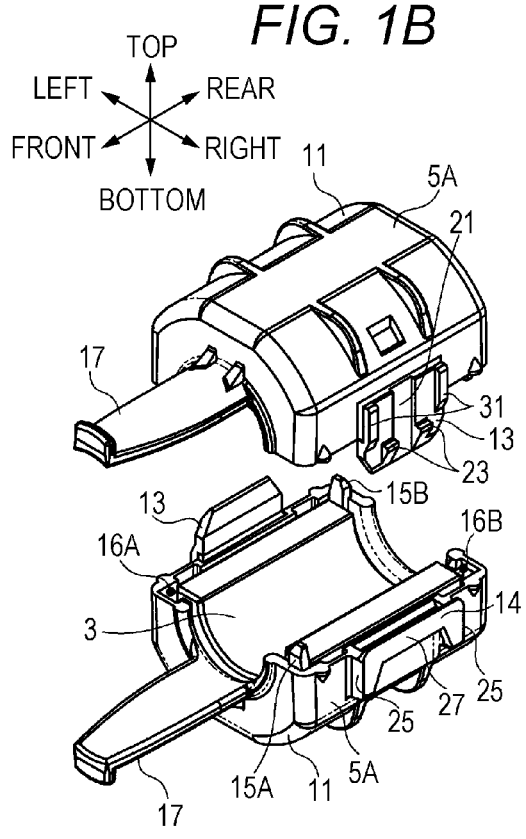
FIG. 1B is an exploded perspective view of the noise current absorber that is seen from upper right front.
Figure 1C:
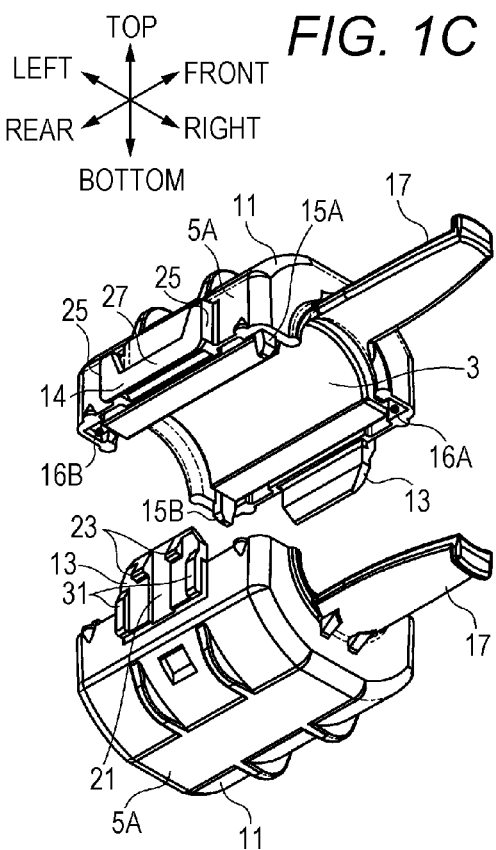
FIG. 1C is an exploded perspective view of the noise current absorber that is seen from lower left front.

A noise current absorber 1 depicted in FIGS. 1A to 1C is attached to an outer periphery of an electric wire 2 in order to absorb noise current flowing through the electric wire 2. This noise current absorber 1 comprises a pair of magnetic bodies 3, 3 and a holder 5 for accommodating these magnetic bodies 3, 3. The paired magnetic bodies 3, 3 are formed in the same shape. Each of the magnetic bodies 3, 3 has a halved cylindrical shape and is formed to exhibit a cylindrical shape as the whole of the pair of magnetic bodies 3, 3 when abutting against each other.

The holder 5 is configured by including a pair of resin components 5A, 5A that is molded in the same shape. The one magnetic body 3 and the one resin component 5A respectively exhibit exactly the same shapes as the other magnetic body 3 and the other resin component 5A when rotated by 180 degrees and vertically reversed about an axis that extends in a front-rear direction as indicated in the drawings.

As depicted in FIGS. 2A to 2D, the each resin component 5A comprises an accommodating portion 11, an engaging portion 13, an engaged portion 14, fitting portions 15A, 15B, fitted portions 16A, 16B, an extending piece 17, and the like. The accommodating portion 11 comprises a first side wall 11A that defines a front end side in the drawings, a second side wall 11B that defines a rear end side in the drawings, and a peripheral wall 11C that defines an outer peripheral side between the first side wall 11A and the second side wall 11B. The magnetic body 3 is accommodated in a recess 11E that is surrounded by the first side wall 11A, the second side wall 11B, and the peripheral wall 11C.

When the recesses 11E, 11E that are respectively provided in the pair of resin components 5A, 5A abut against each other, one pair of the engaging portion 13 and the engaged portion 14 and the other pair of the engaging portion 13 and the engaged portion 14 are engaged with each other. In addition, one pair of the fitting portion 15A and the fitted portion 16A and the other pair of the fitting portion 15B and the fitted portion 16B are fitted to each other. Due to these engagement structure and fitting structure, the pair of resin components 5A, 5A is fixed to each other, and the magnetic bodies 3, 3 respectively accommodated in the accommodating portions 11, 11 are held in a state of exhibiting the cylindrical shape by the holder 5.

The engaging portion 13 comprises a groove 21 that extends in an insertion direction with respect to the engaged portion 14 (the up-down direction as indicated in the drawings) and a pair of locking claws 23, 23 projected at positions on both sides of the groove 21 that is held therebetween (a front side and a rear side as indicated in the drawings). The engaged portion 14 comprises a pair of supports 25, 25 projected to provide a space, in which the engaging portion 13 can be guided, therebetween and a bridge 27 that is stretched between the pair of supports 25, 25.

The supports 25, 25 are projected from an outer peripheral surface of the accommodating portion 11. A gap 29 (see FIG. 2A) in which the engaging portion 13 is inserted is formed at a position that is surrounded by the outer peripheral surface of the accommodating portion 11, the supports 25, 25, and the bridge 27. In the case where the engaging portion 13 is inserted in this gap 29, the engaging portion 13 is displaced to an engagement position while at least one of the engaging portion 13 and the engaged portion 14 is elastically deformed. Then, when the engaging portion 13 reaches the engagement position, the pair of locking claws 23, 23 is hooked on the bridge 27. As a result, the engaging portion 13 is brought into a state incapable of being pulled from the engaged portion 14.

In addition, the engaging portion 13 comprises restricting portions 31, 31. In the state that the engaging portion 13 is inserted in the engaged portion 14, the one restricting portion 31 on a front side in the drawings is located either at a position where the one restricting portion abuts against the one support 25 on the front side in the drawings or at a position where the one restricting portion can abut against the one support 25 on the front side in the drawings when being slightly displaced to the front. Meanwhile, the other restricting portion 31 on a rear side in the drawings is located either at a position where the other restricting portion abuts against the other support 25 on the rear side in the drawings or at a position where the other restricting portion can abut against the other support 25 on the rear side in the drawings when being slightly displaced to the rear. In this way, for example, the one restricting portion 31 on the front side in the drawings restricts the engaging portion 13 from being excessively displaced to the front in the drawings at a position between the supports 25, 25. In addition, for example, the other restricting portion 31 on the rear side in the drawings restricts the engaging portion 13 from being excessively displaced to the rear in the drawings at the position between the supports 25, 25.

Accordingly, the engaging portion 13 is inhibited from being significantly displaced in the front-rear direction in the drawings. Thus, unexpected and excessive deformation of the engaging portion 13 or another portion, which is caused by the excessive displacement of the engaging portion 13, is inhibited. Therefore, occurrence of a problem that the engagement is released in conjunction with such excessive deformation is inhibited.

As depicted in FIGS. 3A to 3B, the noise current absorber 1 that is configured as described above is attached to the electric wire 2 from positions on both sides of the electric wire 2 that is held therebetween. At this time, the engaging portion 13 and the engaged portion 14 are engaged with each other, and thus the noise current absorber 1 is fixed to the electric wire 2. In this state, the magnetic bodies 3, 3 exhibit the cylindrical shape while surrounding a periphery of the electric wire 2. In this way, noise current absorbing capacity is exhibited. When it is desired to rigidly fix the noise current absorber 1 to the electric wire 2, as depicted in FIG. 3B, it is preferred that the electric wire 2 and the extending pieces 17, 17 are tightly bound with any member (for example, a bundle-wire band B) from an outer peripheral side of the extending pieces 17, 17 at the positions on both of the sides of the electric wire 2 that is held therebetween.

Figure 4:
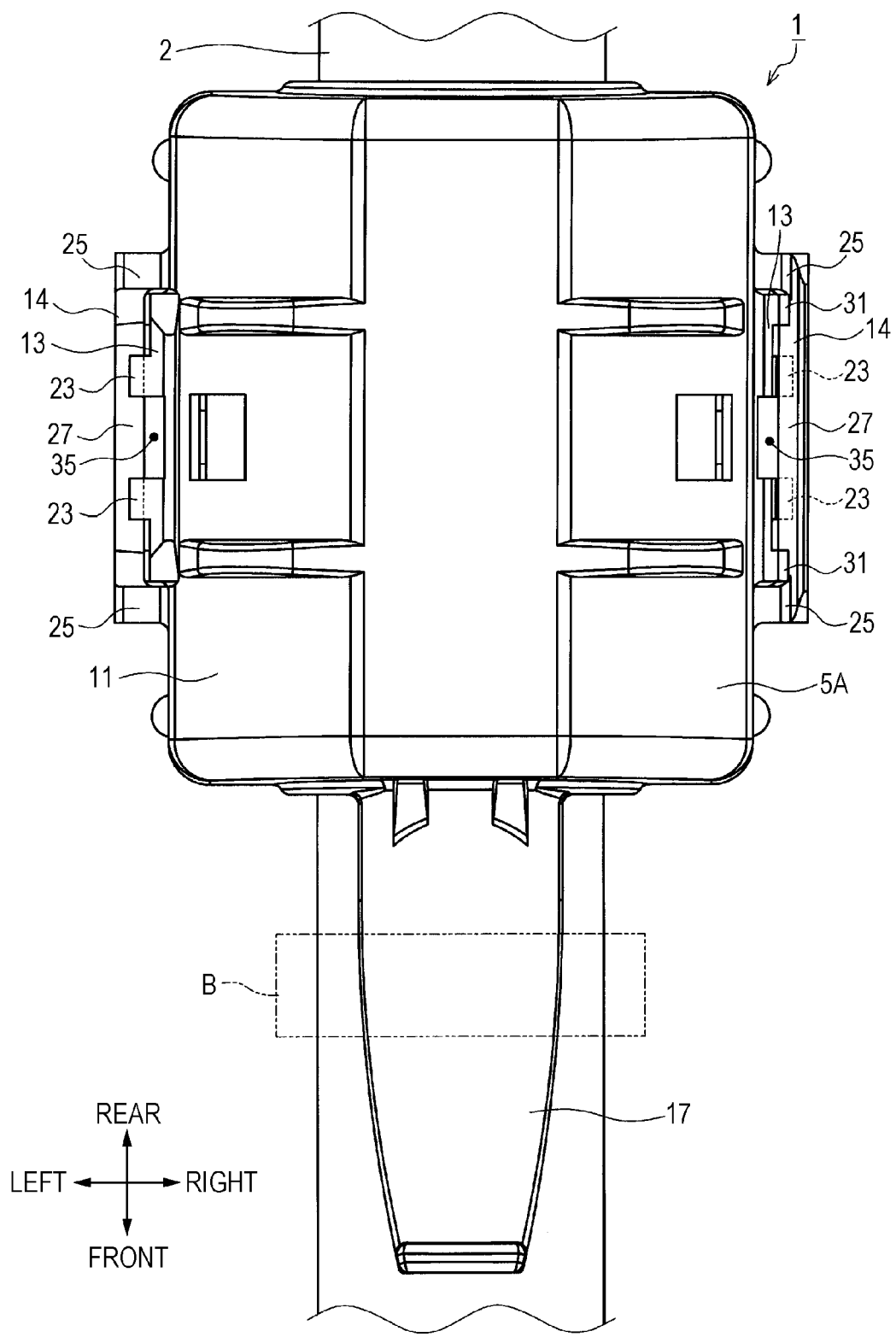
FIG. 4 is an explanatory view of the attached state of the noise current absorber in a planar view.

In addition, in the state that the noise current absorber 1 is attached to the electric wire 2, as depicted in FIG. 4, the groove 21 provided in the engaging portion 13 and the bridge 27 provided in the engaged portion 14 form a through hole 35 that penetrates in the insertion direction of the engaging portion 13 (the up-down direction as indicated in the drawing). Both ends (an upper end and a lower end as indicated in the drawing) of this through hole 35 are opened. Accordingly, despite a fact that the structure in the up-down direction of the engaging portion 13 and the engaged portion 14 on the left side in the drawing and the structure in the up-down direction of the engaging portion 13 and the engaged portion 14 on the right side in the drawing are reversed by 180 degrees, any jig (for example, a dedicated metal rod, a tip of a driver, or the like) can be inserted in both of the through holes 35, 35 from the same direction (for example, from above).

Accordingly, when such a jig is used to perform, for example, an operation for elastically deforming the bridge 27 in a direction to separate from the groove 21 side or an operation for elastically deforming the engaging portion 13 in a direction to separate from the bridge 27 side, the engagement between the locking claws 23, 23 and the bridge 27 is released. Thus, the engaging portion 13 can be displaced in a direction to be relatively pulled out of the engaged portion 14.

It should be noted that, if the through holes 35, 35 as described above are not provided, the engagement between the one engaging portion 13 and the one engaged portion 14 can be released by the operation from above; however, an operation from below is required to perform the equivalent operation on the other engaging portion 13 and the other engaged portion 14. Thus, in a situation where the operation from below is difficult due to a disposed position of the noise current absorber 1, detachment of the noise current absorber 1 is significantly difficult.

Regarding this point, with provision of the through holes 35, 35 as described above, even when the structures in the up-down direction of the engaging portions 13 and the engaged portions 14 are reversed by 180 degrees, both sides of the engagement can be released by the operation in one direction from either above or below, as described above. Thus, the noise current absorber 1 can be easily detached.

In addition, in the above holder 5, in the case where the pair of the fitting portion 15A and the fitted portion 16A and the other pair of the fitting portion 15B and the fitted portion 16B are each in the fitted state to each other, the pair of accommodating portions 11, 11 is maintained in a state of being arranged at specified relative positions even when an operation for releasing the engagement between the engaging portion 13 and the engaged portion 14 is performed by using the jig.

Accordingly, in contrast to a holder in which the relative positions of the pair of accommodating portions 11, 11 are misaligned upon receipt of an operational force when the operation for releasing the engagement between the engaging portion 13 and the engaged portion 14 is performed by using the jig, a cross section (a cross section perpendicular to a penetrating direction) of the through hole 35 is inhibited from being changed by occurrence of such misalignment. Thus, compared to the holder in which the cross section of the through hole 35 is reduced, for example, excessive restraint of the jig and in turn difficulty in operating the jig during releasing of the engagement is inhibited. Therefore, it is possible to easily perform engagement releasing work on the holder 5 as described above.

Furthermore, a relative positional relationship between the engaging portion 13 and the engaged portion 14 is maintained when the pair of accommodating portions 11, 11 is maintained in the state of being arranged at the specified relative positions. In such a case, occurrence of unnecessary twisting between the engaging portion 13 and the engaged portion 14 is inhibited. Thus, since there is no need to add an excessive deforming operation for eliminating such twisting, the operation for releasing the engagement between the engaging portion 13 and the engaged portion 14 can be smoothly performed.

The description has been made so far on the exemplary embodiment of the invention. However, the invention is not limited to the above exemplary embodiment but can be implemented in various modes. For example, in the above embodiment, the pair of the engaging portion 13 and the engaged portion 14 is provided on each of the right side and left side in the drawings, that is, the two pairs of the engaging portion 13 and the engaged portion 14 are provided in total. However, two or more pairs of the engaging portion 13 and the engaged portion 14 may be provided on each of the right side and left side depending on the size of the noise current absorber 1. The above configuration can also be adopted in this case.

In addition, in the above embodiment, the fitting structure including the fitting portions 15A, 15B and the fitted portions 16A, 16B is provided. However, whether such a fitting structure is provided or not is arbitrary. Furthermore, in the above embodiment, the extending piece 17 is provided. However, whether the extending piece 17 is provided or not is also arbitrary.

It should be noted that the electric wire 2 is exemplified as an object that obtains a noise absorbing effect in the above embodiment. This electric wire may be either a power line or a signal line. In other words, all types of electric wires, through which the noise current is considered to be propagated, can be the application objects of the invention.

The invention claimed is:

1. A holder for a noise current absorber, comprising:
a pair of accommodating portions; and
one or more pairs of an engaging portion and an engaged portion, wherein
the pair of accommodating portions is configured that the accommodating portions comprise recesses respectively, each recess is capable of accommodating each of a pair of magnetic bodies therein, and the pair of magnetic bodies abuts against each other to exhibit a cylindrical shape or an annular shape as a whole of the pair of magnetic bodies when the recesses are arranged to face each other and the accommodating portions abut against each other in a state that each magnetic body is accommodated in each recess,
the one or more pairs of the engaging portion and the engaged portion are provided to each of the pair of accommodating portions and are configured to be able to maintain a state that the pair of magnetic bodies exhibits the cylindrical shape or the annular shape by engagement of the engaging portion and the engaged portion with each other when the recesses are arranged to face each other and the accommodating portions abut against each other,
the engaging portion and the engaged portion are configured to be engaged with each other in a case where at least one of the engaging portion and the engaged portion is displaced to an engagement position while being elastically deformed and reaches the engagement position when the engaging portion is inserted in the engaged portion, and furthermore,
the engaging portion and the engaged portion are configured to form a through hole that penetrates in an insertion direction of the engaging portion in a state of being engaged with each other, the through hole is configured that a jig can be inserted in the through hole from either one of openings provided at both ends of the through hole, and the engaging portion and the engaged portion are configured that engagement between the engaging portion and the engaged portion is released and the engaging portion can be pulled out of the engaged portion when at least one of the engaging portion and the engaged portion is applied with an external force to be elastically deformed by using the jig inserted in the through hole.

2. The holder for a noise current absorber according to claim 1, comprising
a pair of resin components that is molded in a same shape, wherein
the accommodating portion, the engaging portion, and the engaged portion are integrally molded in each resin component, and
the engaging portion provided in one of the pair of resin components and the engaged portion provided in the other resin component are configured to be engaged with each other, and the engaging portion provided in the other resin component and the engaged portion provided in the one resin component are engaged with each other.

3. The holder for a noise current absorber according to claim 2, wherein
the engaging portion comprises a groove and a pair of locking claws,
the groove is formed to extend in the insertion direction,
the pair of locking claws is projected at positions on both sides of the groove that is held therebetween,
the engaged portion comprises a pair of supports and a bridge,
the pair of supports is projected to provide a space, in which the engaging portion can be guided, therebetween,
the bridge is stretched between the pair of supports, and
the engaging portion is configured that the engaging portion is brought into a state incapable of being pulled out of the engaged portion when the engaging portion is inserted in a gap that is surrounded by the pair of supports and the bridge and the pair of locking claws hooks on the bridge, and that the groove and the bridge form the through hole in this state.

4. The holder for a noise current absorber according to claim 3, wherein
the engaging portion comprises a restricting portion,
the restricting portion is configured that, when the engaging portion is displaced in a direction of the gap between the pair of supports in the state of being inserted in the engaged portion, the restricting portion abuts against the support on a displacement direction side and thereby restricts further displacement of the engaging portion to the displacement direction side.

5. The holder for a noise current absorber according to claim 4, comprising,
one or more pairs of a fitting portion and a fitted portion, wherein
the one or more pairs of the fitting portion and the fitted portion are provided to each of the pair of accommodating portions and are configured that the fitting portion and the fitted portion are fitted to each other when the recesses are arranged to face each other and the accommodating portions abut against each other, and
the fitting portion and the fitted portion are configured to maintain a state that the pair of accommodating portions is arranged at specified relative positions even in a case where an operation for releasing engagement between the engaging portion and the engaged portion is performed by using the jig in a state of being fitted to each other.

6. The holder for a noise current absorber according to claim 3, comprising,
one or more pairs of a fitting portion and a fitted portion, wherein
the one or more pairs of the fitting portion and the fitted portion are provided to each of the pair of accommodating portions and are configured that the fitting portion and the fitted portion are fitted to each other when the recesses are arranged to face each other and the accommodating portions abut against each other, and
the fitting portion and the fitted portion are configured to maintain a state that the pair of accommodating portions is arranged at specified relative positions even in a case where an operation for releasing engagement between the engaging portion and the engaged portion is performed by using the jig in a state of being fitted to each other.

7. The holder for a noise current absorber according to claim 2, comprising,
one or more pairs of a fitting portion and a fitted portion, wherein
the one or more pairs of the fitting portion and the fitted portion are provided to each of the pair of accommodating portions and are configured that the fitting portion and the fitted portion are fitted to each other when the recesses are arranged to face each other and the accommodating portions abut against each other, and
the fitting portion and the fitted portion are configured to maintain a state that the pair of accommodating portions is arranged at specified relative positions even in a case where an operation for releasing engagement between the engaging portion and the engaged portion is performed by using the jig in a state of being fitted to each other.

8. The holder for a noise current absorber according to claim 1, wherein
the engaging portion comprises a groove and a pair of locking claws,
the groove is formed to extend in the insertion direction,
the pair of locking claws is projected at positions on both sides of the groove that is held therebetween,
the engaged portion comprises a pair of supports and a bridge,
the pair of supports is projected to provide a space, in which the engaging portion can be guided, therebetween,
the bridge is stretched between the pair of supports, and
the engaging portion is configured that the engaging portion is brought into a state incapable of being pulled out of the engaged portion when the engaging portion is inserted in a gap that is surrounded by the pair of supports and the bridge and the pair of locking claws hooks on the bridge, and that the groove and the bridge form the through hole in this state.

9. The holder for a noise current absorber according to claim 8, wherein
the engaging portion comprises a restricting portion,
the restricting portion is configured that, when the engaging portion is displaced in a direction of the gap between the pair of supports in the state of being inserted in the engaged portion, the restricting portion abuts against the support on a displacement direction side and thereby restricts further displacement of the engaging portion to the displacement direction side.

10. The holder for a noise current absorber according to claim 9, comprising,
one or more pairs of a fitting portion and a fitted portion, wherein
the one or more pairs of the fitting portion and the fitted portion are provided to each of the pair of accommodating portions and are configured that the fitting portion and the fitted portion are fitted to each other when the recesses are arranged to face each other and the accommodating portions abut against each other, and
the fitting portion and the fitted portion are configured to maintain a state that the pair of accommodating portions is arranged at specified relative positions even in a case where an operation for releasing engagement between the engaging portion and the engaged portion is performed by using the jig in a state of being fitted to each other.

11. The holder for a noise current absorber according to claim 8, comprising,
one or more pairs of a fitting portion and a fitted portion, wherein
the one or more pairs of the fitting portion and the fitted portion are provided to each of the pair of accommodating portions and are configured that the fitting portion and the fitted portion are fitted to each other when the recesses are arranged to face each other and the accommodating portions abut against each other, and
the fitting portion and the fitted portion are configured to maintain a state that the pair of accommodating portions is arranged at specified relative positions even in a case where an operation for releasing engagement between the engaging portion and the engaged portion is performed by using the jig in a state of being fitted to each other.

12. The holder for a noise current absorber according to claim 1, comprising,
one or more pairs of a fitting portion and a fitted portion, wherein
the one or more pairs of the fitting portion and the fitted portion are provided to each of the pair of accommodating portions and are configured that the fitting portion and the fitted portion are fitted to each other when the recesses are arranged to face each other and the accommodating portions abut against each other, and
the fitting portion and the fitted portion are configured to maintain a state that the pair of accommodating portions is arranged at specified relative positions even in a case where an operation for releasing engagement between the engaging portion and the engaged portion is performed by using the jig in a state of being fitted to each other.

13. A noise current absorber comprising:
a pair of magnetic bodies;
a pair of accommodating portions; and
one or more pairs of an engaging portion and an engaged portion, wherein
the pair of magnetic bodies is configured to exhibit a cylindrical shape or an annular shape as a whole of the pair of magnetic bodies when abutting against each other,
the pair of accommodating portions is configured that the accommodating portions comprise recesses respectively, each recess is capable of accommodating each of the pair of magnetic bodies therein, and the pair of magnetic bodies exhibits the cylindrical shape or the annular shape when the recesses are arranged to face each other and the accommodating portions abut against each other in a state that each magnetic body is accommodated in each recess,
the one or more pairs of the engaging portion and the engaged portion are provided to each of the pair of accommodating portions and are configured to be able to maintain a state that the pair of magnetic bodies exhibits the cylindrical shape or the annular shape in a case where the engaging portion and the engaged portion are engaged with each other when the recesses are arranged to face each other and the accommodating portions abut against each other,
the engaging portion and the engaged portion are configured to be engaged with each other in a case where, when the engaging portion is inserted in the engaged portion, at least one of the engaging portion and the engaged portion is displaced to an engagement position while being elastically deformed and reaches the engagement position, and furthermore,
the engaging portion and the engaged portion are configured to form a through hole that penetrates in an insertion direction of the engaging portion in a state of being engaged with each other, the through hole is configured that a jig can be inserted in the through hole from either one of openings provided at both ends of the through hole, and the engaging portion and the engaged portion are configured that, when at least one of the engaging portion and the engaged portion is applied with an external force to be elastically deformed by using the jig inserted in the through hole, engagement between the engaging portion and the engaged portion is released and the engaging portion can be pulled out of the engaged portion.

* * * * *